United States Patent [19]
Wray

[11] 4,271,439
[45] Jun. 2, 1981

[54] ELECTRONIC GAIN AND NOISE CONTROL FOR RECORDING OF ANALOG INFORMATION

[75] Inventor: William R. Wray, Sudbury, Mass.

[73] Assignee: Polaroid Corporation, Cambridge, Mass.

[21] Appl. No.: 32,942

[22] Filed: Apr. 24, 1979

[51] Int. Cl.³ ............................. G11B 5/45; G11B 5/02
[52] U.S. Cl. .......................................... 360/65; 360/68
[58] Field of Search ........................ 360/25, 31, 65, 68

[56] References Cited

U.S. PATENT DOCUMENTS

| | | | |
|---|---|---|---|
| 3,659,060 | 8/1972 | Wolff et al. | 360/31 |
| 3,832,044 | 8/1974 | Deeran | 352/14 |
| 3,856,387 | 12/1974 | Wray et al. | 352/5 |

FOREIGN PATENT DOCUMENTS 2001221  1/1979  United Kingdom ..................... 360/68

OTHER PUBLICATIONS

"The Hi-Fi Book"-Published by Stereo Components Systems, Inc. 1979, p. 125.
"Signetics Analog Data Manual"-Signetics Corp., Sunnyvale Calif., pp. 482, 483, 794 through 805.

*Primary Examiner*—Vincent P. Canney
*Attorney, Agent, or Firm*—Edward S. Roman

[57] ABSTRACT

In an apparatus for analog recording having a dynamic compressor for amplifying an analog input signal wherein the gain varies in response to an applied control signal, there is provided an improved limiter for providing a gain reducing influence to the applied control signal to control the gain to a generally single-valued function of the analog input signal for analog input signals having an amplitude within a select range.

10 Claims, 5 Drawing Figures

ELECTRONIC GAIN AND NOISE CONTROL FOR RECORDING OF ANALOG INFORMATION

BACKGROUND

This invention relates to high performance electronic gain and noise control circuits for analog record and playback devices. High performance is used here in the sense of providing reproduction of analog information, typically audio signals, with relatively true fidelity over a selected frequency range and a selected dynamic range. It also includes the introduction of selected control of the analog reproduction to avoid distortion and listener distraction that otherwise occur during certain movements of a magnetic medium, e.g. tape rewind.

More particularly, the invention provides a magnetic record/playback system, sometimes referred to simply as a recorder, that provides multiple controls of gain and of noise. Specific control features of the recorder are the cancellation of noise that the playback transducer unit picks up, the limiting of record gain in response to excessive signal amplitudes, and the muting of playback during certain operations. Further, the invention enables these features to be provided together with the conventional noise reduction that a compandor makes possible.

High performance magnetic record/playback systems for analog information are well known, and many—commonly termed tape decks—are commercially available, especially for audio reproduction. "The Hi-Fi Book", 1979, available from Tech Hi-Fi and published by Stereo Components Systems, Inc., describes illustrative, present-day commercially-available consumer tape decks as well as dynamic compandors. It is understood that this audio equipment employs a variety of electronic control circuits that provide gain control noise reduction, limiting, dynamic expansion, dynamic compression, equalization, and perhaps other functions considered to enhance the performance of audio reproduction with a magnetic storage medium.

The application of a dynamic compandor to provide high performance electronic gain control in consumer and other analog equipment is also known. See for example the "Signetics Analog Data Manual" available from Signetics Corporation, Sunnyvale, Calif. Note in particular pages 482, 483, and 794–805 of that publication.

With this state of the art, it is an object of this invention to provide improved gain and noise control in a high performance record/playback system. It is also an object of the invention to provide a multiple of such control features with an economy of circuit stages.

A particular object of the invention is to provide a magnetic recorder arrangement that cancels noise picked up by the playback transducer unit in a manner suitable for use in a variety of record/playback systems.

Another particular object is to provide a record/playback system having a compandor and which also provides record gain limiting and playback muting.

A further object of the invention is to provide high performance electronic circuits which readily provide a combination of the foregoing features.

It is also an object to provide circuits which provide the foregoing features and are suited for consumer electrical products and in particular which are compatible with multi-media equipment. Thus it is an object to provide the foregoing electronic gain and noise control in equipment which provides a visual display together with audio reproduction. One particular instance of this equipment is photographic projection combined with audio reproduction, as in a sound movie projector.

Other objects of the invention will in part be set forth below and will in part be obvious from the following description.

BRIEF DESCRIPTION OF DRAWINGS

For a fuller understanding of the nature and objects of the invention, reference should be had to the following detailed description taken in connection with the accompanying drawings, in which:

FIG. 5 is a graph illustrating the limiting operation of the invention.

GENERAL DESCRIPTION

Figure 1:
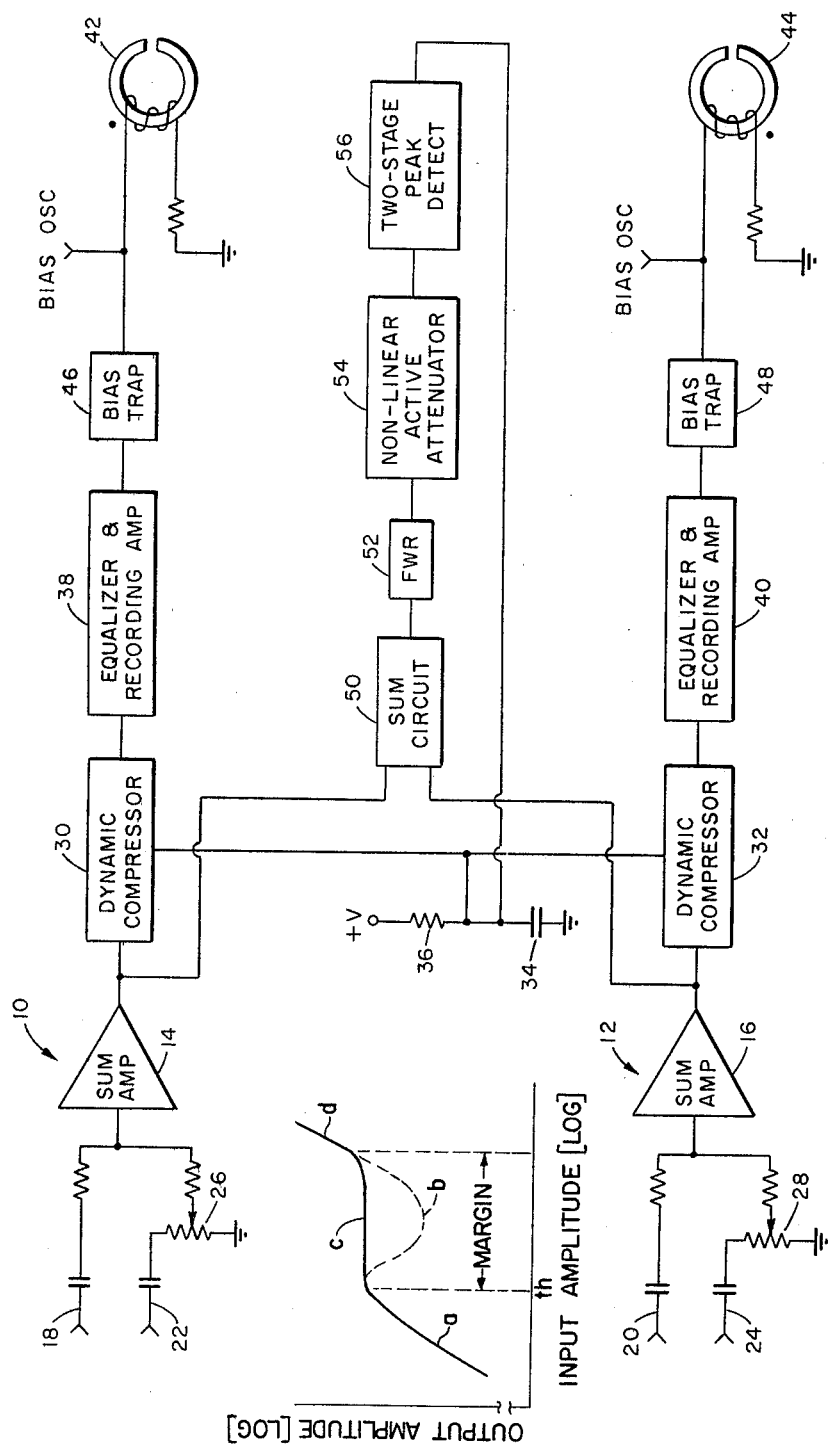
FIG. 1 is a schematic diagram, partly in block form, of the record section of a magnetic audio recorder embodying features of the invention.

A magnetic audio tape recorder according to the invention provides cancellation of hum and other noise which the playback head transduces, and provides limiting of record gain when subjected to excessive input signals. Such input signals would, if processed without limiting, saturate the recording tape. The limiting hence avoids undesirable distortion that would otherwise occur upon playback. The recorder also provides muting of playback, i.e. significant if not complete reduction of playback volume, during operations when the recorder would otherwise produce undesirable audio output. Examples of such operations include start-up when the tape is not at proper speed, and tape rewind.

The noise cancellation can be applied to a variety of recorders, including monaural and stereophonic, and those having compandors and those without. The limiting and the muting which the invention provides, on the other hand, make advantageous use of dynamic compandor stages. Hence they are applicable to recorders employing a compandor. In particular, the limiter operates with a dynamic compressor in a record circuit, and the muting operates with a dynamic expandor in a playback circuit. Compandors, however, are useful with optical recorders as well as with recorders that employ a magnetic storage medium, and accordingly the limiting and the muting of the invention have equally broad application.

More particularly, the invention provides noise cancellation by recording audio signals with opposite relative phases in two tracks, which can be parallel monaural tracks or the left and right channels of a stereophonic recording. A dual track, e.g. stereo, playback head transduces the signals in the two tracks and introduces another phase reversal of one signal relative to the other. The two audio signals are then in phase and can be processed and reproduced very nearly as conventional. For example, they can be combined and amplified as appropriate for a monaural system, or they can be amplified separately and applied to left channel and right channel speakers in a stereophonic system. However, electronic noise, such as motor hum and transformer hum, which was not present in the record circuit but enters the system at the playback head, is out of phase in the two signals which the transducers apply to the playback circuit. The invention combines these out-of-phase noise components of the two signals and they substantially cancel one another. Filters enable the noise-bearing signal components to be combined for cancellation with little if any apparent degradation of stereophonic audio reproduction.

A feature of this recorder noise control is that it is of general application, including to both stereophonic as well as monaural systems. It thus facilitates the design of systems where the playback transducer operates in a noisy environment, i.e. in the presence of a high level of noise such as occurs where motors, transformers and like devices are present. One such application is to provide audio reproduction in a sound movie projector.

The further electronic gain control which the invention provides is practiced in a record/playback system which has a compandor, because the gain control for both limiting recording gain and for muting playback utilize the compandor circuit. More particularly, a compandor of known type employs an analog multiplier, to multiply the signal being processed by the rectified value of that signal, and has a filter capacitor that averages the rectifier current. The resultant voltage on the capacitor controls the multiplication. Such a multiplier is also termed a variable gain cell, and the gain of the cell correspondingly is a function of the voltage on the filter capacitor.

The invention makes use of this dependency of a dynamic expandor on the rectifier filter capacitor to mute a recorder playback circuit by discharging the capacitor, or otherwise clamping it to a selected condition, whenever muting is desired. In this way, the invention provides muting control with a minimum of additional components.

The invention similarly makes use of the dependency of a dynamic compressor on the associated rectifier filter capacitor to limit the gain of a record circuit. To this end, the invention provides circuit elements that augment the capacitor current, in a manner that decreases the compressor gain, when the input signal amplitude exceeds a selected level. That is, these circuit elements apply a gain-limiting current to the compressor capacitor in response to a selected measure of the audio signals applied for recording. The limiting stage has no effect on the dynamic compressor when the audio input signals are below the threshold level. It becomes operative only with excessive signal levels that would produce undesirable output distortion, such as saturation of the magnetic recording tape. A further feature of the limiter is the provision of a non-linear attenuator that enables the limiter to operate with low distortion, and particularly to reduce gain but still maintain the gain characteristic as essentially a single-valued function of input signal amplitude. The gain of the dynamic compressor normally progressively decreases with input signal amplitude, and the limiter of this invention further reduces the gain characteristic in response to input signals above the threshold value. The attenuator controls the gain reduction so that the compressor output signal for any given input amplitude is at least as great as the output signal for lesser input amplitudes.

Another feature of the invention is that the several electronic gain and noise control functions which it provides are readily combined in a single magnetic or optical recorder, i.e. a single record/playback system.

Moreover, the introduction of recorder gain limiting and of playback muting, which the invention provides to a recorder employing a compandor, introduce few if any restrictions on the remainder of the record and playback circuits. Thus, these features of the invention can be practiced in a variety of compandor embodiments in combination with other features, with a corresponding increase in audio performance but with minimal circuit complexity.

The invention accordingly comprises the features of construction, combinations of elements, and arrangement of parts exemplified in the constructions hereinafter set forth, and the scope of the invention is indicated in the claims.

DESCRIPTION OF ILLUSTRATED EMBODIMENTS

Figure 2:
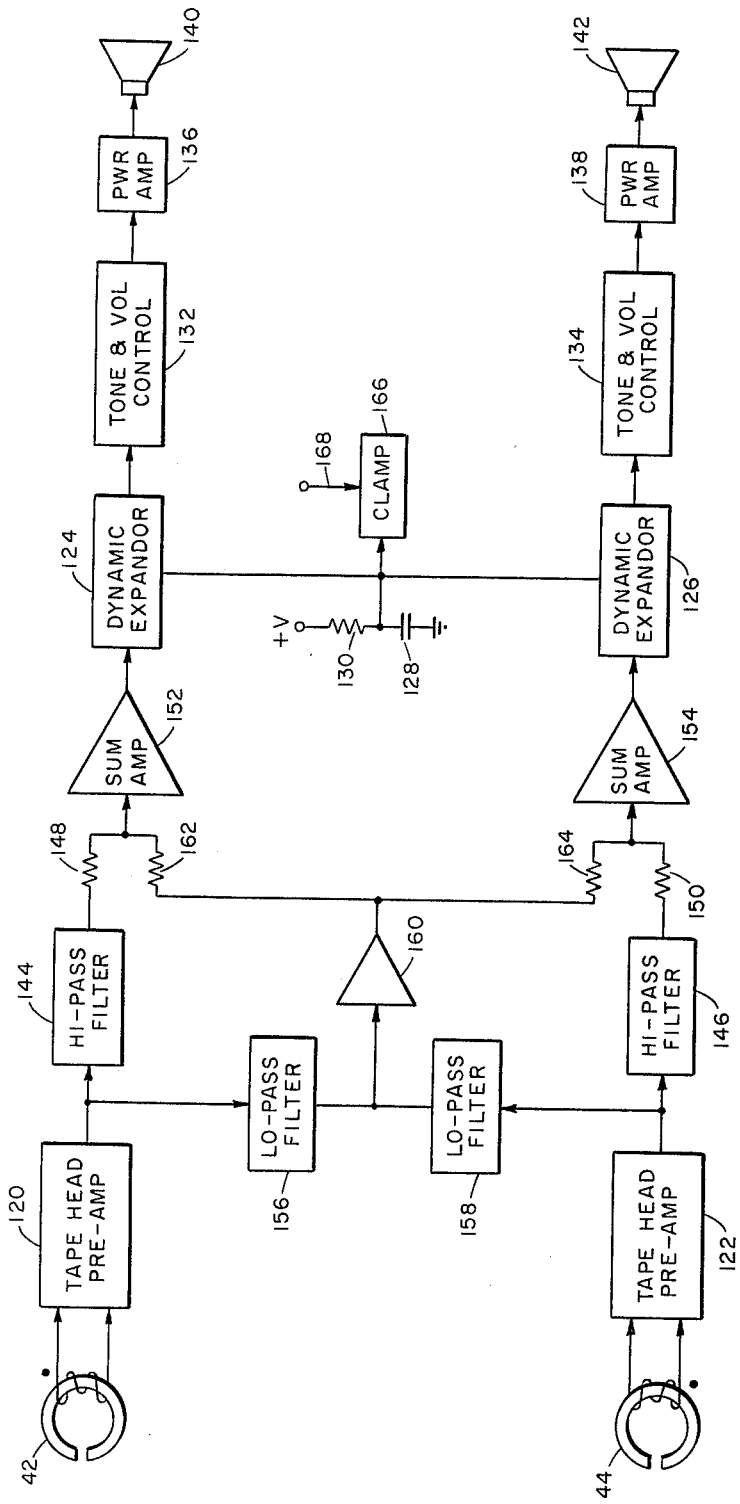
FIG. 2 is a schematic diagram, partly in block form, of the playback section of a magnetic audio recorder embodying features of the invention.

FIGS. 1 and 2 show the record section and the playback section, respectively, of a stereophonic magnetic tape recorder, i.e. record/playback system, illustrating features of the invention. The record section of FIG. 1 has left channel and right channel input stages 10, 12. Each input stage has a summing amplifier 14, 16 that allows mixing of two input signals applied to a first input terminal 18, 20 and a second input terminal 22, 24. The former input terminal for example can be connected with a microphone, and the latter input terminal typically serves as the conventional accessory input. Each accessory input terminal is connected to the corresponding summing amplifier 14, 16 through a volume controlling variable resistor 26, 28.

As also shown, a dynamic compressor 30, 32 reduces the dynamic range of the summed input signals in each channel. Each compressor is of the type which employs a capacitor to average the signal that controls the compressor gain. The illustrated record section employs a single capacitor 34 for this purpose. It is common to both channels and hence is connected to both compressors 30 and 32. Also common to the two compressors is a resistor 36 connected between the capacitor 34 and a supply of positive voltage (+V).

An equalizer and recording amplifier 38, 40 amplifies the compressor output separately for each channel, with appropriate recording equalization. The resultant signals are applied to left channel and right channel recording transducers 42, 44, respectively, together with the output of a recording bias oscillator (not shown). Each channel of the record section also includes a bias trap 46, 48 that isolates the output of the equalizer and recording amplifier from the bias oscillator signal. The foregoing arrangement in the record section is conventional in stereophonic magnetic tape recorders and can be implemented with any of numerous circuit arrangements within the skill of those versed in this art.

With further reference to FIG. 1, the record section limits the gain characteristic of the two compressors 30, 32 for input signals of excessive amplitude with a circuit which, above this threshold, controls the voltage (or charge) on capacitor 34. The illustrated limiter has a summing circuit 50 that arithmetically combines portions of the left channel and the right channel signals from the amplifiers 14 and 16. The combined analog signals are rectified with a full-wave rectifier 52, and a non-linear active attenuator 54 applies a selected portion of the resultant rectified signal to a two-stage peak detector 56. The detector produces a capacitor-charging signal with a level that corresponds to the peak value of analog input signals that are above a threshold level.

The limiter has no significant effect on the record section for input signals within a dynamic range that can be recorded and played back without significant distortion, in which case the capacitor 34 current is determined exclusively by the operation of the dynamic compressors 30 and 32. Input signals with peak values in excess of this selected range, however, actuate the limiter to control the capacitor 34 voltage in a manner that reduces the compressor gain characteristic. The threshold level which activates the limiter typically is the input signal level that would saturate the recording tape.

The illustrated limiter controls the capacitor voltage in response to the peak value of the audio input signals, rather for example than in response to the average or RMS value, to attain fast response. However, limiting in response to peak value tends to reduce the compressor gain excessively to such an extent that it introduces noticeable signal distortion when the limiter is active. The present limiter avoids this shortcoming, and yet retains the desirable fast response which results from detecting the peak value of the analog signal, by providing the attenuator 54. This element provides two functions. One is to apply a selected portion of the input signal amplitude to the peak detector 56, and thereby select the input amplitude which initiates the limiting action. The second function of the attenuator 54 is to progressively decrease the input signal portion applied to the detector, beginning with input amplitudes at which the peak-responsive limiting otherwise becomes excessive.

The result of this non-linear attenuator action coupled with the peak-responsive limiting is that the compressor transfer characteristic is essentially a single-valued function of input amplitude. The plot in FIG. 5 of idealized compressor output signal amplitude as a function of input signal amplitude illustrates the foregoing functions and operating features which the invention provides. Below the threshold level (th) of input amplitude, the curve portion (a) shows that the output amplitude increases progressively with input amplitude. Curve portion (b) illustrates the unwanted decrease in output amplitude that the peak-responsive limiting tends to produce. It causes the compressor to have a multivalued transfer function, which is undesired. The present limiter does not exhibit such a transfer characteristic, but rather causes the output amplitude during limiting to increase only slightly, and then remain essentially flat, as curve portion (c) shows. In actual practice, the compressor output may vary slightly above and below the smooth curve portion (c), but such variations can be restricted to an amount that is relatively insignificant. Curve portion (d) illustrates that for still larger input signals, above a margin beyond the (th) level, the effect of the limiter ceases and the compressor operates with measurable gain. Input signals of this level, however, are excessive and seldom encountered.

The FIG. 1 elements 50, 52, 54 and 56 which the invention provides are herein termed a limiter, for they thus form a control circuit for limiting the gain of the dynamic compressors 30, 32 in the manner described with reference to FIG. 5.

Figure 3:
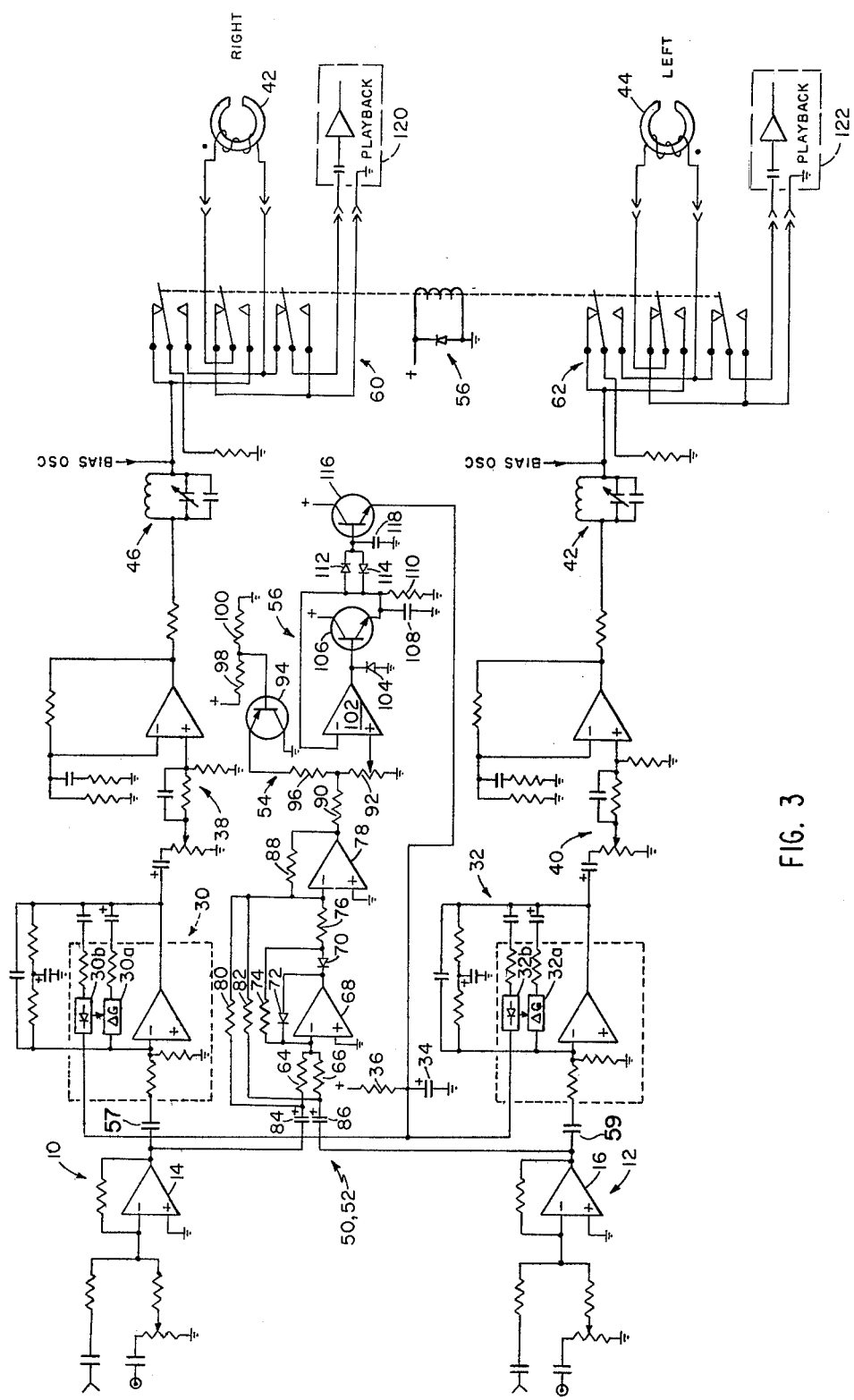
FIGS. 3 and 4 are detailed schematic diagrams of magnetic recorder record and playback circuits, respectively, according to FIGS. 1 and 2.

FIG. 3 shows that a preferred construction of the record section of FIG. 1 employs an input stage 10, 12 that has an operational-type summing amplifier 14, 16 and a series blocking capacitor 57, 59 at the output.

Each compressor 30, 32 has a multiplier or variable gain cell 30a, 32a and a rectifier cell 30b, 32b in the feedback path of an operational amplifier. The "Signetics Analog Data Manual" noted above describes one further construction and the operation of this type of compressor. Each equalizer and recording amplifier 38, 40 has a conventional construction with both series and parallel R-C equalizer circuits as shown and an operational amplifier. Likewise, each bias trap 46, 48 employs a known L-C filter construction.

A record/playback relay 58 with a set 60, 62 of three-pole, double-throw contacts for each signal channel connects each transducer 42, 44 to the appropriate channel of the record section. The relay 58 switches the contact sets 60, 62 from the playback condition shown to provide recording operation. In the limiter portion of the record section, the full-wave rectifier 52 which FIG. 3 shows employs a known operational amplifier circuit that yields an output having a precise absolute value in relation to the applied analog input signals. Resistors 64 and 66 sum left channel and right channel signals from the input stages 10 and 12 to an operational amplifier 68 to provide the summing circuit 50 of FIG. 1. With respect to the rectifier 52, there is provided: a rectifying diode 70 in the output line of amplifier 68, diode 72 for providing feedback around the amplifier 68, and resistor 74 for providing feedback around the series combination of the amplifier 68 and the diode 70. A summing resistor 76 is in series between diode 70 and the inverting input of a second operational amplifier 78. Further summing resistors 80 and 82 connect the incoming left channel and right channel signals, after d.c. blocking capacitors 84 and 86, to this same inverting input of amplifier 78. A further resistor 88 provides feedback of the amplifier 78. The design and operation of a precisely-operating full-wave rectifier of this construction is known and is not described further. See, for example, the "Handbook of Operational Amplifier Applications", Copyright 1963, and published by Burr-Brown Research Corporation in Tucson, Ariz. 85706.

With further reference to FIG. 3, the illustrated attenuator 54 employs a series input resistor 90 and a shunt potentiometer or variable voltage divider 92 from which the input to the two-stage peak detector 56 is tapped. The attenuator also has a transistor 94 in an emitter-follower configuration with the collector connected to the common return or ground conductor and with a resistor 96 connected between the emitter and the interconnection of resistor 90 and potentiometer 92. The transistor base is connected to the interconnection between resistors 98 and 100 which form a biasing voltage divider between a positive supply voltage and the return conductor.

The first stage of the peak detector 56 has an operational amplifier 102 which has the non-inverting input connected to the tap of the potentiometer 92. The output from the operational amplifier 102 is connected to the base of a transistor 106. The transistor collector is connected to a positive supply voltage, and a capacitor 108 in parallel with a resistor 110 are connected to the return conductor from the transistor emitter. A diode 104 is connected to the return conductor from the transistor base; it serves to protect the base-emitter junction from excessive reverse voltage. The output of the first peak detector stage, at the interconnection of capacitor 108 and transistor 106, is fed back to the inverting input of the operational amplifier 102.

The second peak detecting stage employs oppositely-poled diodes 112 and 114 connected between the capacitor 108 and the base of an emitter-follower transistor 116 which forms the output element of the limiter. The transistor collector is again connected to the positive supply, and capacitor 118 is connected to the return conductor from the transistor base. The emitter of transistor 116 is connected to the interconnection of the external compressor capacitor 34 and the resistor 36, both shown in FIGS. 1 and 3.

The limiter which elements 50, 52, 54 and 56 form operates in the following manner. Each channel of the record section which FIGS. 1 and 3 show—which includes the input stages 10 and 12 having summing amplifiers 14 and 16, the dynamic compressors 30 and 32, the equalizers and recording amplifiers 38 and 40, the bias oscillator inputs and the bias traps 46 and 48, the contact sets 60 and 62 of the record/playback relay 58, and the transducers 42 and 44—operates in a conventional manner to record on magnetic tape or other medium audio or other analog input signals having amplitudes within a selected amplitude range. The limiter has no significant effect for such signals because the detector 56 presents a relatively high impedance to the capacitor 34. In particular, the transistor 116 is non-conductive and has a relatively high impedance to ground from the emitter. The summing circuit 50 and full-wave rectifier 52 of the limiter combine portions of the audio signals in each channel and rectify them, but the peak amplitude of the resultant rectified signal is insufficient to activate the detector 56.

The threshold level for limiting action is determined essentially by the sum of the voltage drops of the transistor 106 base-emitter junction, of the diode 112 junction, and of the base-emitter junction of transistor 116. When the portion of the rectified signal selected with the variable voltage divider 92 exceeds this threshold level, the first stage of the voltage detector 56 develops a voltage across capacitor 108 which follows the peak values of the rectified signal.

The second stage of the peak detector charges capacitor 118 according to the peak value of the voltage across capacitor 108 which exceeds the forward drop through diode 112. The diode 114 provides a discharge path for the capacitor 118 when the voltage on that capacitor exceeds the voltage across the first stage capacitor 108 by more than the forward drop through diode 114. The second detector stage hence operates non-linearly, in order to block from the detector output the peak-following ripple voltage across capacitor 108. The forward voltage drops of diodes 112 and 114 exceed this ripple voltage. Hence the second stage capacitor is charged in response to the charge on capacitor 108, but without a significant ripple component.

Transistor 116 is an emitter follower buffer circuit which isolates the compressor filter capacitor 34 and other elements connected therewith from the peak-detecting capacitor 118. As indicated, the transistor is normally nonconducting, in which case it presents a high impedance from the output emitter terminal to either the base or the collector. When the input audio signals increase to exceed the detector threshold level, however, the transistor 116 commences conduction and the resultant emitter current charges the compressor filter capacitor 34. As the latter capacitor 34 becomes charged in this manner, it tends to diminish the conduction in transistor 116, to a degree which depends on the voltage on the second peak detector capacitor 118 relative to the voltage on the compressor capacitor 34. Thus, the limiter, when activated by excessive audio input signals, augments or increases the charge on the compressor capacitor 34, which in turn limits the gain characteristic of the two compressors 30 and 32. Note that this action of the limiter on the single, common rectifier capacitor 34 is applied equally and simultaneously to the two compressors, which is of considerable advantage.

The transistor 94 in attenuator 54 modifies the foregoing action by shunting the level-selecting variable voltage divider 92 non-linearly as a function of audio signal amplitude. When the applied analog signal amplitude is below a second threshold normally greater than the detector threshold, e.g. by three decibels, the transistor 94 is non-conducting and hence has a high emitter-collector impedance to ground in parallel with the variable voltage divider 92. The action of the attenuator then is determined solely by the voltage divider. However, when the applied audio signals exceed the second level and drive the transistor 94 to commence conduction, it presents a resistive shunt across the variable voltage divider 92. The value of this shunting resistance of the transistor decreases with further increase in audio signal amplitude. The conduction of transistor 94 hence diminishes the level of the rectified audio signals fed to the peak detector 56 in a manner which reduces the limiting action which the peak detector would otherwise apply to the compressor capacitor 34, as described above with reference to FIG. 5.

The combination of the two actions, i.e. of the non-linear active attenuator and of the peak detector, limits the response or transfer characteristic of the dynamic compressors 30 and 32 to be essentially flat and hence single-valued as a function of increasing audio amplitude above the level at which limiting occurs. For example, the transfer or response characteristic in this operating range, which corresponds to the FIG. 5 portion (c), typically is flat within plus or minus one decibel or less. The attenuator 54 construction with a single transistor 94 as FIG. 3 shows can be modified with conventional skills to employ further transistors, each becoming conductive at a different level of input signal, to increase the "margin" portion (c) of the FIG. 5 graph.

FIGS. 1 and 3 show another feature of the invention, which is that the transducers 42 and 44 are arranged to record information with opposite relative phases. The illustrated arrangement achieves this by connecting one transducer "backward" relative to the other. This is shown in FIG. 2 by having the coils on the two transducers wound in opposite directions. FIG. 2 also shows the out-of-phase arrangement of the two transducers 42 and 44 by marking each with a single black dot in the manner conventional for designating opposite relative polarity of electromagnetic windings.

The result of this out-of-phase arrangement of the transducers 42 and 44, when connected with the record circuit as shown in FIGS. 1 and 3, is that the two transducers record information with opposite relative phases, i.e. the magnetic flux patterns impressed on a recording medium by transducer 42 are 180 degrees out of phase relative to the flux patterns which the other transducer 44 records.

As now described with reference to FIGS. 2 and 4, when the transducers play back information recorded in this phase opposition manner, the playback section restores an in-phase relation to the signals read from the recording medium. On the other hand, electrical noise which the transducers pick up during playback operation has opposite relative phases in the two playback channels, due to the out-of-phase arrangement of the transducers. The playback section of the recorder selectively adds playback signals which include such noise in a manner that cancels the out-of-phase noise components to a large extent. The information-bearing playback signal resulting from the summation, however, is processed further in the playback section, to recover the audio information, in a manner equivalent to the conventional processing of playback signals which are not combined for noise cancellation.

More particularly, FIG. 2 shows that a two-channel, stereophonic, playback section, for use with the record section of FIGS. 1 and 3, employs the same transducers 42 and 44. During playback operation, the FIG. 3 relay 58 switches each transducer 42, 44 to feed playback signals to a right channel tape head pre-amplifier 120 and to a left channel tape head pre-amplifier 122, respectively. FIG. 2 shows the transducers connected with the pre-amplifiers in this manner, and for simplicity does not show the FIG. 3 relay 58 with its sets of contact 60, 62, similar to the simplified showing in FIG. 1.

FIG. 2 also shows that the playback section has, in each channel, a dynamic expandor 124, 126 that restores to the audio playback signals the original dymanic range that was present prior to compression in the record section. The two expandors 124, 126 employ a common capacitor 128 to develop a signal that controls the gain of each expandor unit. A common charging resistor 130 is connected from the capacitor to the supply of positive voltage (+V). The dynamically-restored left channel and right channel signals are applied to separate tone and volume control circuits 132 and 134. The resultant signals are applied to power amplifiers 136, 138, respectively, each of which drives a loudspeaker 140, 142. The foregoing elements of the playback section can employ any of numerous conventional constructions, and have well-known operation.

The playback section in addition has, connected in each channel in series succession between the pre-amplifier and the dynamic expandor a high-pass filter 144, 146, a summing resistor 148, 150, and a summing amplifier 152, 154. A right channel low-pass filter 156 and a left channel low-pass filter 158 apply low frequency signals from each corresponding transducer to a summing point to which the input of a further amplifier 160 is connected. Summing resistors 162 and 164 apply equal portions of the amplifier 160 output signal to the summing amplifiers 152 and 154, respectively.

The recorder playback section of FIG. 2 operates in the following manner with the record section of FIG. 1 to cancel noise which the transducers 42 and 44 pick up during playback operation. The noise of concern typically is electromagnetic radiation at the 60 Hertz line voltage frequency, and initial multiples of that. This radiation is generally present where electrical equipment such as fluorescent lights, motors and transformers are operating. When exposed to this radiation, the transducers tend to introduce unwanted electrical noise signal components at these frequencies into the playback section. However, due to the phase opposition arrangement of transducer 42 relative to transducer 44, the noise components picked up in transducer 42 are of opposite phase relative to those picked up in transducer 44. Further, the two transducers typically are disposed very close together, side-by-side, in the usual configuration of a stereo tape head and hence are generally exposed to essentially the same noise fields and therefore pick up noise signals with essentially equal frequency and amplitude characteristics. Thus the electrical noise components which the two transducers pick up are in large part identical, except for the phase opposition which results from the out-of-phase arrangement of the transducers when connected with the playback section.

The out-of-phase arrangement of the two transducers also introduces a 180-degree relative phase shift into the audio signals which one transducer plays back from the magnetic recording medium relative to that which the other transducer plays back. However, as described with reference to FIGS. 1 and 3, the out-of-phase arrangement of the transducers introduces a like relative phase shift into the audio signals during recording. Accordingly, the further phase reversal introduced upon playback of this recorded information results in the audio signals output from the two transducers being in phase, i.e. having the same relative phase.

Thus, the out-of-phase arrangement of the transducers 42 and 44 during both record operation and subsequent playback operation develops audio playback signals which are in phase. Electrical noise, on the other hand, which the transducers pick up during playback operation is out of phase in the two playback channels. The separate playback pre-amplifiers 120 and 122 amplify the audio signals and the noise which each receives from the respective transducer 42, 44 without the introduction of any phase difference in one channel relative to the other.

The low-pass filters 156 and 158 of FIG. 2 are designed to pass (with relatively little attenuation) lower frequency signals, which include the principal noise which the transducers pick up. These filters have a relatively high, signal-blocking characteristic at higher frequencies. The high-pass filters 144 and 146, on the other hand, have essentially the reverse characteristics and hence block the frequency band which the filters 156 and 158 pass, but pass the higher frequency band which the low-pass filters block. The high-pass filters 144 and 146 hence pass and apply to the summing amplifier 152 the higher frequency signals output from the pre-amplifiers 120, 122. These signals have relatively little noise picked up by the transducers, but contain the desired higher frequency audio playback signals from the transducers.

Each low-pass filter 156, 158 applies to the summing amplifier 160 the lower frequency playback signal, which includes both desired audio signals played back from the recording medium and noise which the transducers pick up. The noise signals from the two channels are out of phase and hence cancel at the input of the summing amplifier 160, at least to a relatively large extent. The audio signals which the low-pass filters pass, however, are in phase and hence add together. The summing amplifier 160 amplifies the resultant summation signal with a gain selected to restore the losses which the low-pass filters 156 and 158 introduce in excess of the losses which the high-pass filters 144 and 146 introduce.

The combined low frequency audio playback signal output from the summing amplifier 160 is divided equally at the amplifier output and applied to the right channel and left channel playback circuits through resistors 162 and 164, respectively. These signals, from the low-pass filters 156 and 158, accordingly are applied to each summing amplifier 152, 154 with an amplitude characteristic which matches that of the high frequency signal which the summing amplifiers receive by way of the high-pass filters 144 and 146. The input signals to the summing amplifiers 152, 154 hence differ from the output signals from the pre-amplifiers 120, 122 in essentially two aspects. One is the absence at the summing amplifier inputs of transducer picked up noise, which has largely been cancelled due to the relative phase reversals. The other aspect is that the low frequency signals applied to the two summing amplifiers are identical and hence have no stereophonic separation, whereas the high frequency signals applied to the summing amplifiers from the high-pass filters have the same stereophonic separation with which they were recorded. This lost low-frequency stereophonic separation may be perceptible, but it is considered a lesser drawback than the gain in reproduction fidelity attained by cancellation of the transducer-introduced noise.

With further reference to FIG. 2, the illustrated recorder/playback section also has provision for muting audio reproduction in response to an external control signal. This is desirable, for example, to silence distorted audio output which the playback section otherwise normally produces during rewinding of a magnetic tape medium, and during start-up operation when the tape or other magnetic medium is not yet at the proper playback speed. The invention provides this muting function in the illustrated recorder playback section by providing a clamp circuit 166 connected to the expandor capacitor 128 and operable to impose a specified voltage on the capacitor in response to an external muting control signal. The illustrated clamp circuit normally has no effect on the circuit operation. However, a muting control signal applied over line 168 actuates the clamp to essentially short circuit the capacitor to the ground return conductor. This clamping operation constrains the capacitor 128 voltage to be essentially zero, and in response each expandor 124, 126 has essentially zero gain. The result is that the audio output from the playback section is essentially completely silenced during the duration of the applied muting signal.

Figure 4:
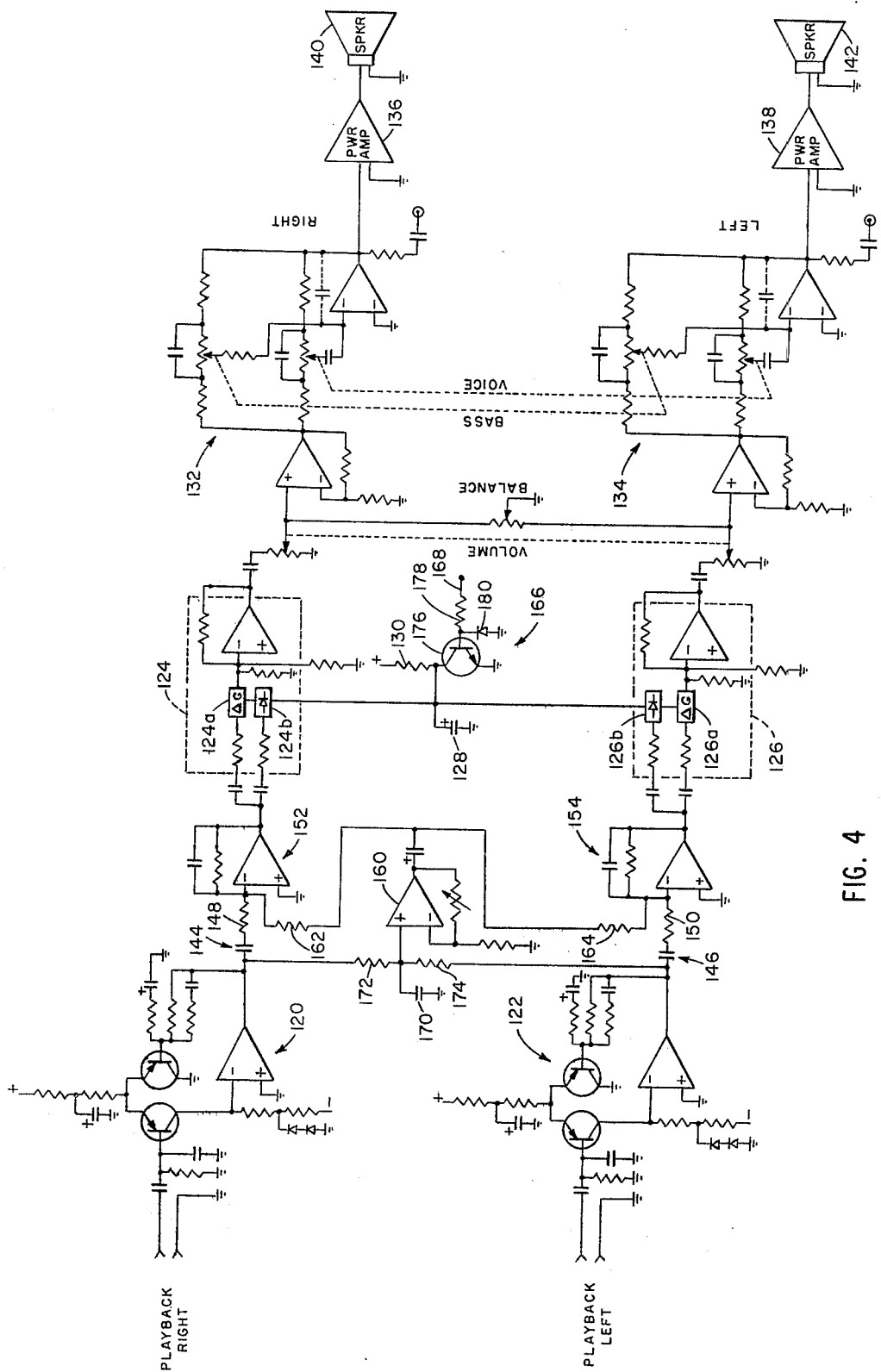

FIG. 4 shows a preferred construction of the playback section of FIG. 2 which is advantageously used with the record section of FIG. 3. FIG. 4 does not show the record/playback relay 58 or the relay contact sets 60, 62, and does not show the transducers 42 and 44, all of which are shown in FIG. 3. The playback circuit of FIG. 4 connects to the relay contacts as indicated in FIG. 3, where the input portion of the playback section pre-amplifiers 120 and 122 are shown connected with the relay contacts 60 and 62. FIG. 4 shows in further detail where the relay contacts connect with the tape head pre-amplifiers 120 and 122. These pre-amplifiers provide pre-amplification and audio playback equalization as conventionally practiced. The illustrated low-pass filters 156 and 158 are constructed with a common shunt capacitor 170 and with separate resistors 172 and 174. The common interconnection of these three components is connected with the non-inverting input of an operational amplifier which forms the summing amplifier 160. The output signal from the summing amplifier is applied to the resistors 162 and 164, as shown, for driving the summing amplifiers 152 and 154. Each high-pass filter 144 and 146 is constructed with a capacitor in series with the resistor 148 and 150, as shown.

The gain in each channel of the playback section through the pre-amplifiers 121 and 122 and through the summing amplifiers 152, 154 is selected, as is the conventional practice, to attain audio signal levels at the input of the dynamic expandors 124 and 126 of the same level as appears in the record section of FIGS. 1 and 3 at the output of the dynamic compressors 30 and 32.

Each dynamic expandor 124, 126 is constructed with an operational amplifier driven at the inverting input with the output signal from an analog multiplier or gain cell 124a, 126a. Each gain cell provides signal amplification with a gain controlled by an applied signal that a rectifier cell 124b, 126b produces in conjunction with the expandor capacitor 128, all in known and conventional manner as described for example in the Signetics publication referenced hereinabove.

The clamp circuit 166 is illustrated as constructed simply with a transistor 176 having a grounded emitter, and the collector of which is connected to the interconnection of capacitor 128 and of resistor 130. A series current-limiting resistor 178 applies the mute-controlling signal from line 168 to the transistor base, and a diode 180 is connected to ground from the transistor base to protect the base-emitter junction from excessive reverse bias. A positive, high level mute-controlling signal which forward biases the transistor base-emitter junction drives the transistor 176 to conduction. In this ON condition, the transistor applies essentially a short circuit across the capacitor 128 and thereby clamps the capacitor voltage to zero for muting audio reproduction. A less positive or slightly negative, low-level, input signal on line 168 drives the transistor 176 to be non-conducting, in which case it presents a high emitter-collector impedance across the capacitor 128. In this OFF condition of the transistor, the clamp circuit has no significant effect on the expandor operation.

A muting control signal of the required character can readily be developed with any of numerous circuit arrangement and according to the overall design of the magnetic recorder for which the illustrated playback section is used. An example of such a circuit, which develops START-UP and RUN signal levels, is disclosed in the commonly-assigned patent application of William R. Wray entitled "Control System For Uniform Advancement Of Intermittently-Advancing Recording Medium" filed on even date herewith.

With further reference to FIG. 4, each tone and volume control circuit 132 and 134 has a conventional construction which provides, each with separate potentiometers in each channel, volume control, base control and voice control; and further provides balance control with a single potentiometer, as shown. The output signals from these circuits 132 and 134 are applied to the separator power amplifiers 136 and 138 which drive the left channel and the right channel speakers 140 and 142.

The analog signal recorder described above thus provides control of noise, provides high quality limiting of gain in the record section, and provides muting of audio reproduction in the playback circuit. The noise control employs highly efficient signal cancellation. Although described with reference to a stereophonic system, those skilled in the art will appreciate that this feature of the invention can be practiced in a monaural system. To this end, one can use a two-channel stereophonic tape head or other transducer unit, and divide the input analog signals to be recorded equally between the two transducers. The out-of-phase transducers record the information in two tracks and upon playback recover of the two channels of audio information. There is no need for filters, such as the filters 144, 146, 156, 158, which the illustrated stereophonic system employs. Instead, the separate playback signals in the two channels are added directly, and the out-of-phase noise signals which the transducers pick up cancel substantially upon being thus combined. The analog playback signals, on the other hand, are in phase and add in a manner that reinforces them to provide a single channel output. Alternatively of course the two playback channels can be processed separately and broadcast with separate speakers.

The gain limiting and the muting which the invention provide are readily implemented in compandor systems, i.e. systems having dynamic compression in the record section and dynamic expansion in the playback section, with relatively few additional components.

It will thus be seen that the invention efficiently attains the objects set forth above, including those made apparent from the preceding description. It is understood that certain changes may be made in the above constructions without departing from the scope of the invention, and accordingly it is intended that all matter contained in the above description or shown in the accompanying drawings be interpreted as illustrative and not in a limiting sense.

It is also to be understood that the following claims are intended to cover all of the generic and specific features of the invention described herein, and all statements of the scope of the invention which as a matter of language might be said to fall therebetween.

What is claimed is:

1. In apparatus for analog recording on a storage medium and having dynamic compressor means for amplifying an analog input signal to be recorded with a gain that varies in response to an applied control signal, an improvement for limiting the gain for analog input signals which exceed a first select amplitude without exceeding a second select amplitude greater than the first select amplitude comprises:
   limiter means for introducing a gain-reducing influence to the applied control signal in accordance with a measure of the analog input signal amplitude in excess of the first select amplitude, and for controlling said gain-reducing influence to provide a compressor gain that is substantially a single-valued function of the analog input signal for analog input signals having an amplitude within a range between the first select amplitude and the second select amplitude, said limiter means further comprising a nonlinear active attenuator for providing said measure in response to a nonlinear variation of the analog input signal amplitude.

2. In apparatus according to claim 1, the further improvement in which said limiter means includes means for rectifying the analog input signal and for introducing said gain-reducing variation in response to a nonlinear variation of the rectified analog input signal.

3. In apparatus according to claim 1, the further improvement wherein said limiter means includes means for providing said measure in response to a peak value function of the nonlinearly varied analog input signal amplitude.

4. In apparatus according to claim 1, the further improvement in which said limiter means includes peak-detecting means for providing said measure in response to a peak value of the nonlinearly varied analog input signal amplitude, wherein said nonlinear active attenuator responds to the analog input signal to change the relative amount of the analog input signal which said peak-detecting means measures, and to effect said change progressively in correspondence with an increase in analog input signal level in excess of the second select amplitude.

5. In apparatus for analog recording on a storage medium and having dynamic compressor means for amplifying an analog input signal to be recorded with a gain that varies in response to an applied control signal, an improvement for limiting the gain for analog input signals which exceed a first select amplitude without exceeding a second select amplitude greater than the first select amplitude comprises:
   limiter means for introducing a gain-reducing influence to the applied control signal in accordance with a measure of the analog input signal amplitude in excess of said first select amplitude, and for controlling said gain-reducing influence to provide a compressor gain that is substantially a single-valued function of the analog input signal for analog input signals having an amplitude within a range between said first select amplitude and said second select amplitude, said limiter means comprising peak detecting means for providing said measure in response to a peak value of the analog input signal amplitude, and means responsive to the analog input signal for changing the relative amount of the analog input signal which said peak-detecting means measures, and for effecting said change progressively in correspondence with an increase in analog input signal level in excess of the second select amplitude wherein said amount-changing means includes a voltage divider means for applying a selected portion of analog input signal amplitude to said peak-detecting means, and active semiconductor means shunting said voltage divider means with an impedance responsive to the analog signal amplitude in excess of the second select amplitude.

6. A limiter circuit apparatus, for use with an analog compressor device for compressing the dynamic range of an analog signal to be recorded and wherein the compressor device has a variable gain element and a rectifier element which controls the gain of the gain element with a voltage derived from a capacitor, for limiting the gain of the compressor in response to analog signal amplitudes in excess of a select amplitude, said limiter circuit comprising:
   peak-detecting means for applying current to the capacitor in response to analog signal amplitudes in excess of the select amplitude, and
   nonlinear active attenuator means responsive to the analog signal amplitude for varying nonlinearly the portion of the analog signal to which said peak-detecting means responds.

7. The limiter circuit apparatus according to claim 6 further comprising rectifier means for applying a rectified analog signal to said peak-detecting means.

8. The limiter circuit apparatus according to claim 6 wherein said peak-detecting means includes threshold means for disabling said current-applying operation in response to signal amplitudes less than said select amplitude.

9. The limiter circuit apparatus according to claim 6 further comprising a full-wave rectifier for receiving analog signals to be recorded, and wherein said attenuator means includes an adjustable voltage divider connected for applying to said peak-detecting means a selected portion of the rectifier output level, and a signal-responsive semiconductor element shunting said voltage divider.

10. The limiter circuit apparatus according to claim 6 wherein said peak-detecting means further comprises:
a first peak-detecting stage, and
a second nonlinear peak-detecting stage connected to receive a selected nonlinear function of the output signal from said first peak-detecting stage.

* * * * *